United States Patent [19]

Pastor et al.

[11] 4,267,205

[45] May 12, 1981

[54] PROCESS FOR LOW-TEMPERATURE SURFACE LAYER OXIDATION OF A SEMICONDUCTOR SUBSTRATE

[75] Inventors: Ricardo C. Pastor, Manhattan Beach; Remedios K. Chew, Canoga Park; Luisa E. Gorre, Gardena, all of Calif.

[73] Assignee: Hughes Aircraft Company, Culver City, Calif.

[21] Appl. No.: 66,606

[22] Filed: Aug. 15, 1979

[51] Int. Cl.³ .................... B05D 5/12; H01L 21/316
[52] U.S. Cl. ...................................... 427/93; 427/82; 357/52
[58] Field of Search ............ 427/93, 82, 255.4, 255.2, 427/255.3; 357/52

[56] References Cited

U.S. PATENT DOCUMENTS

| Re. 28,385 | 4/1975 | Mayer | 427/399 |
|---|---|---|---|
| 3,692,571 | 9/1972 | Colton et al. | 427/93 |
| 4,176,206 | 11/1979 | Inoue | 427/82 |

FOREIGN PATENT DOCUMENTS 1521950  7/1971  Fed. Rep. of Germany ............ 427/93

OTHER PUBLICATIONS

Hess et al., "Kinetics of the Thermal Oxidation of Silicon in $O_2$/HCl Mixtures" Journal of the Electrochemical Soc. 124 (5), 1977, p. 735.
Katz et al., "Defect Formation During High Pressure Low Temperature Steam Oxidation of Si" Journal of Electrochemical Society, 125 (10), 1978, p. 1680.
Blanc, "A Revised Model for the Oxidation of Si by Oxygen" Applied Phys. Lett. 33 (5), Sep. 1, 1978, pp. 424–426.
Irene et al., "Silicon Oxidation Studies: The Role of $H_2O$" Journal of the Electrochemical Soc. 124 (11), 1977, p. 1757.
Irene, "The Effects of Trace Amounts of Water on the Thermal Oxidation of Silicon" Journal of Electrochemical Society 121 (12), 1974, p. 1613.
Sunami, "Thermal Oxidation of Phosphorous-Doped Polycrystalline Silicon in Wet Oxygen" Journal of Electrochemical Society 125 (6), 1978, p. 892.

Primary Examiner—John D. Smith
Attorney, Agent, or Firm—Mary E. Lachman; W. H. MacAllister

[57] ABSTRACT

The specification discloses a process for forming a coherent, uniform oxide layer on the surface of a selected semiconductor material by heating a wafer of the selected semiconductor material at a predetermined elevated temperature in an atmosphere conducive to the formation of atomic oxygen for a period of time sufficient to enable the atomic oxygen to react with the surface atoms of the wafer and thus form the coherent, uniform oxide layer. The predetermined elevated temperature is sufficiently low to avoid adverse effects, such as dopant migration, on the wafer. In a preferred embodiment of the present invention, a coherent, uniform layer of silicon dioxide is formed on the surface of a silicon wafer by heating the wafer in a vapor mixture of iodine and water at a temperature of 750° C. and one atmosphere of pressure.

4 Claims, 1 Drawing Figure

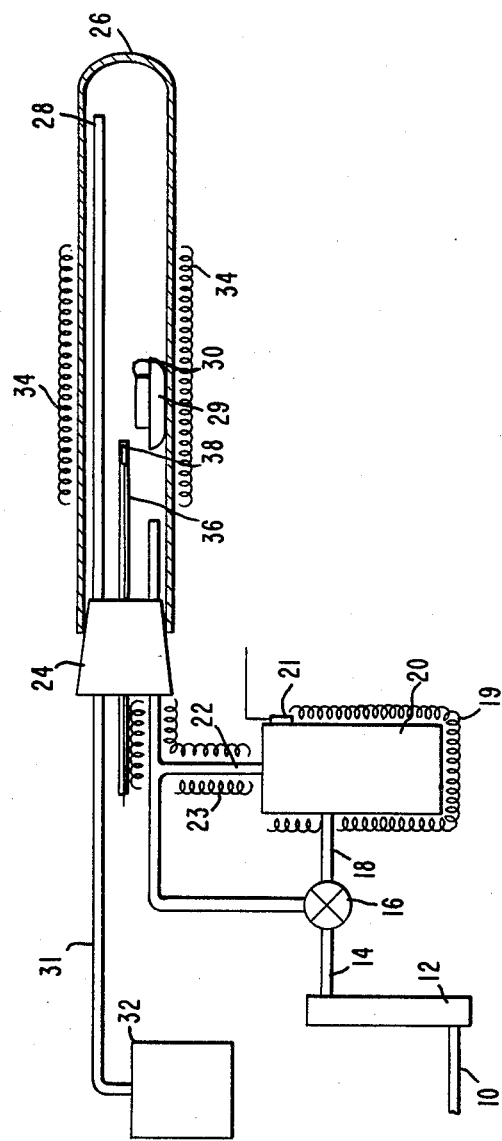

PROCESS FOR LOW-TEMPERATURE SURFACE LAYER OXIDATION OF A SEMICONDUCTOR SUBSTRATE

TECHNICAL FIELD

This invention relates generally to the manufacture of semiconductor devices and, more particularly, to a process for forming a coherent, uniform oxide layer on the surface of a selected semiconductor material.

BACKGROUND ART

In the manufacture of semiconductor devices, an oxide layer is frequently used for masking during such procedures as etching, solid state diffusion, or ionimplantation, or as a passivation layer to permanently protect the surface of the substrate. These oxide layers are usually deposited by either liquid phase growth, vapor phase growth, controlled pyrolysis, or precipitation (i.e., polycrystalline deposit). A major disadvantage of the liquid phase deposition is that it is difficult to grow extremely uniform thin films over a large area, which is a feature that is highly desirable in certain solar cell and integrated circuit technologies. Vapor phase deposition can be accomplished by physical vapor deposition (PVD), such as sublimation, sputtering, flash evaporation, molecular beam epitaxy (MBE), and by chemical vapor deposition (CVD), which makes use of reactive intermediates. One disadvantage of physical vapor deposition is that it is impractical when incongruent volatilization occurs, as is the case for GaAs.

With the decrease in device dimensions required in advanced integrated circuit technologies, the need arises to exert a tighter control over diffusion profiles in order to maintain relatively small device geometries. This has led to the desire to perform device processing at lower temperatures in order to suppress the movement of dopants and achieve better control of device geometry. Various approaches to this problem in the case of silicon devices have performed processing at one atmosphere pressure but above 1000° C., or at 700° C. and compensated for the lower temperature by the use of a high concentration of the gas-phase reactant ($H_2O$ or oxygen), i.e. at a high pressure. In particular, a substrate such as silicon may be treated with HCl and oxygen ($O_2$) or trichlorethylene and $O_2$ at one atmosphere pressure and at a temperature exceeding 1000° C., to form $SiO_2$, as described by R. E. Tressler, J. Stach, and D. M. Metz in the publication entitled "Gas Phase Composition Considerations in the Thermal Oxidation of Silicon in Cl-H-O Ambients," in the *Journal of the Electrochemical Society*, Vol. 124, No. 4, 1977, page 607. A five hour treatment of silicon oriented along the (111) axis with ten percent HCl gas (g) in $O_2$ (g), as discussed by D. W. Hess and B. E. Deal in a publication entitled "Kinetics of the Thermal Oxidation of Silicon in $O_2$/HCl Mixtures," in the *Journal of the Electrochemical Society*, Vol. 124, No. 5, 1977, page 735, resulted in oxide layer depositions of the following approximate thicknesses: 1000 angstroms at 900° C., 2000 angstroms at 1000° C., and 3000 angstroms at 1100° C.

In another approach to the problem of surface layer oxidation, water vapor has been used directly as the source of oxygen in the oxidation process, as described by E. A. Irene and R. Ghez, in the publication entitled "Silicon Oxidation Studies: The Role of $H_2O$," in the *Journal of the Electrochemical Society*, Vol. 124, No. 11, 1977, page 1757. By the process of Irene and Ghez, an oxide layer 200 angstroms thick was deposited on a silicon substrate by treatment at 893° C. for five hours with $N_2$ (g) containing 2000 parts per million $H_2O$ (g). It was also determined by Irene and Ghez that water vapor acts as an accelerator for the oxidation process. For example, treatment of a substrate with dry $O_2$ (g) at 893° C. for five hours resulted in the deposition of a oxide layer 500 angstroms thick, while treatment of the substrate with $O_2$ (g) containing 2000 parts per million $H_2O$ (g) under the same conditions resulted in the deposition of an oxide layer 700 angstroms thick. Further studies by E. A. Irene are reported in the publication entitled "The Effects of Trace Amounts of Water on the Thermal Oxidation of Silicon in Oxygen," in the *Journal of the Electrochemical Society*, Vol. 121, No. 12, 1974, page 1613. In this latter work, an oxide layer 300 angstroms thick was formed by treating the substrate at 800° C. for five hours with $O_2$ (g) containing 25 parts per million $H_2O$ (g). In addition, Hideo Sunami, in the publication entitled "Thermal Oxidation of Phosphorus-doped Polycrystalline Silicon in Wet Oxygen," in the *Journal of the Elctrochemical Society*, Vol. 125, No. 6, 1978, page 892, reported that treatment of an undoped silicon substrate at 750° C. for five hours with $O_2$ (g) saturated with $H_2O$ (g) produced from $H_2O$ (liquid) at 90° C. resulted in the deposition of an oxide layer which was 70 angstroms thick, while treatment of a silicon substrate heavily doped with phosphorous ($2.2 \times 10^{21} cm^{-3}$) under the same conditions resulted in the deposition of an oxide layer 500 angstroms thick.

Further, in the publication by Joseph Blanc, entitled "A Revised Model for the Oxidation of Si by Oxygen," in *Applied Physics Letters*, Vol. 33, No. 5, 1978, page 424, it was reported that an excellent agreement was obtained with the experimental data on the oxidation of silicon by dry $O_2$ (g). This model proposes that diffusion through the amorphous oxide is via molecular oxygen, but silicon oxidation occurs through the reaction of a small concentration of atomic oxygen. This model indicates that treatment of a silicon substrate at 893° C. for five hours in dry $O_2$ (g) would deposit an oxide layer 500 angstroms thick.

Finally, L. E. Katz and L. C. Kimerling, in the publication entitled "Defect Formation During High Pressure, Low Temperature Steam Oxidation of Silicon," in the *Journal of the Electrochemical Society*, Vol. 125, No. 10, 1978, page 1680, discussed the oxidation of silicon wafers with steam at a pressure of 300 pounds per square inch at 700° C. for various lengths of time (not stated). The thickness of the oxide layers ranged from 5000 angstroms to 55000 angstroms. The defect-state concentration after high pressure steam oxidation was found to be nearly identical to the preoxidation condition, and this feature was attributed to the use of a low operating temperature.

While all of the above-mentioned methods have achieved surface layer oxidation at temperatures lower than those previously used in the art, none of these methods has, to our knowledge, been able to achieve a uniform and rapid oxidation rate at a temperature as low as 750° C. under a total pressure as low as one atmosphere.

SUMMARY OF THE INVENTION

One purpose of the present invention is to provide a new and improved process for forming a coherent and uniform layer on the surface of a selected semiconductor material at a temperature sufficiently low to provide improved control over diffusion profiles and device geometry.

In order to accomplish this purpose, we have discovered and developed a process for forming a coherent, uniform oxide layer on the surface of a selected semiconductor material by heating a wafer of the selected semiconductor material at a predetermined elevated temperature in an atmosphere conducive to the formation of atomic oxygen for a period of time sufficient to enable the atomic oxygen to react with the surface atoms of the wafer and thus form the coherent, uniform oxide layer. The predetermined elevated temperature is sufficiently low to avoid adverse effects on the wafer. In a preferred embodiment of the present invention, a coherent, uniform layer of silicon dioxide is formed on the surface of a silicon wafer at a temperature of 750° C. and one atmosphere of pressure.

Accordingly, it is an object of the present invention to provide a new and improved process for forming a coherent and uniform oxide layer on the surface of a semiconductor substrate at a temperature sufficiently low to provide improved control over diffusion profiles and thus improve control over resulting device geometries.

Another object of the present invention is to provide a process of the type described which is performed at one atmosphere of pressure.

Still another object is to provide a low-temperature, relatively rapid process for forming a surface oxide layer on a chosen substrate.

A feature of the present invention is that the process described herein is performed by controlled atmosphere processing.

The foregoing and other objects, features, and advantages of the present invention will be apparent from the following more particular description of the preferred embodiment of the invention, as illustrated in the accompanying drawing.

BRIEF DESCRIPTION OF THE DRAWING

FIG. 1 illustrates, in schematic form, a preferred apparatus for carrying out the process of the present invention.

DETAILED DESCRIPTION OF THE INVENTION

In FIG. 1 there is shown, in schematic form, a preferred apparatus for carrying out the present invention. A carrier gas, such as He, is introduced through an inlet tube 10, made of Teflon, pyrex, or polyethylene, into a flowmeter 12, where the flow of the carrier gas is adjusted to a desired value, such as 1 cm$^3$/second. This carrier gas passes from the flowmeter 12 through a tube 14, made of Teflon, pyrex, or polyethylene, through a valve 16, and through a tube 18, also typically made of Teflon, pyrex, or polyethylene, into a pyrex chamber 20, which contains a mixture of I$_2$ (solid) suspended in H$_2$O (liquid) that is kept just below 100° C. The carrier gas bubbles through the I$_2$—H$_2$O mixture in the chamber 20 and serves to keep the I$_2$ dispersed in the H$_2$O. Enough I$_2$ must be used so that I$_2$ vapor is maintained above the H$_2$O in the chamber 20 throughout the entire oxidation process of this invention. Under equilibrium conditions, the partial pressure of H$_2$O is approximately 715 millimeters and the partial pressure of I$_2$ is approximately 45 millimeters.

The chamber 20 is heated to maintain the H$_2$O just below 100° C. and this is accomplished by means of the heating elements 19 which surround the chamber 20. The resistance heating elements 19 may be made of Nichrome and are activated by applying a controlled voltage thereto. A thermocouple or a thermometer 21 is inserted between the outside wall of the chamber 20 and the heating elements 19 in order to monitor the temperature of the chamber 20. The gas mixture comprising I$_2$, H$_2$O and the carrier gas is channeled through the Teflon or pyrex tubing 22, which is kept hot by the heating elements 23 which surround the tubing 22, to prevent crystallization of the I$_2$ (s). The resistance heating elements 23 may also be made of Nichrome and are activated by applying a controlled voltage thereto. The temperature in the tubing 22 must be maintained higher than the temperature in the chamber 20 in order to maintain the I$_2$ in the vapor state. The gas mixture of I$_2$, H$_2$O and the carrier gas passes from the tubing 22, through a cap 24 that is made of Teflon or vitreous silica and finally enters a reaction tube 26 which is made of high purity (99.99%) alumina or vitreous silica.

The reaction tube 26 contains the semiconductor wafer 30 to be processed, which is held in an alumina or vitreous silica boat 29. The reaction tube 26 is provided with a thermocouple 38 which is contained in a well formed by the alumina or vitreous silica tubing 36 which enters the reaction tube 26 through the cap 24. The thermocouple 38 is placed in close proximity to the semiconductor substrate 30 and is used to monitor the temperature in the reaction chamber 26.

The reaction tube 26 is also provided with an alumina or vitreous silica tubing 28 through which gas reactants exit from the reaction tube 26, then pass through an exit tube 31 which is typically made of Teflon, pyrex, or polyethylene, and ultimately enter a pyrex chamber 32, where excess iodine is solidified as it cools to room temperature and is trapped. From the chamber 32, the gas mixture passes to a scrubber (not shown) so that any uncondensed I$_2$ may be removed before the exhaust gas is released to the surrounding atmosphere.

The central section of the reaction tube 26 is provided with selected heating elements 34 which are used to heat the central section of the reaction tube 26 to a predetermined elevated temperature, typically 750° C. for a silicon substrate. The temperature to which the reaction tube 26 is heated, depends on the material of which the the substrate is formed and must be a temperature that is sufficiently low so that the substrate will not be damaged and yet sufficiently high to produce the required atomic oxygen. The heating elements 34 may be also made of Nichrome and are activated by the application of a controlled voltage thereto.

The gas flow control valve 16 is used to bypass the chamber 20 during cool-down after completion of wafer processing; and the carrier gas can then remove any remaining I$_2$ from the apparatus tubing and from the reaction chamber 26. The use of the apparatus of FIG. 1 is described below in the Example.

EXAMPLE

This example illustrates the use of the apparatus described in FIG. 1 in order to carry out the process of the present invention. The following procedure was performed separately on a silicon wafer which was undoped and on a silicon wafer which was doped with indium to a level of 1.5 to 2.0×10$^{17}$ atoms per cm$^3$. The silicon wafer 30 to be processed, having dimensions of 1 centimeter by 1 centimeter, was placed in the alumina boat 29 and then the boat 29 and the wafer 30 were placed in the reaction tube 26, which had a volume of 1600 cm$^3$, so that the wafer was 15 inches from the opening of the tubing 22 which entered the reaction tube 26 through the cap 24. The cap 24 was placed in the opening of the reaction tube 26 in the position shown in FIG. 1. Twenty grams of I$_2$(s) and 40 grams of water were placed in the chamber 20. The heating elements 19 and 23 were activated by the application of a controlled voltage thereto. The heating elements 34, which were made of Nichrome, surrounding twelve inches of the central section of the reaction tube 26, were activated by applying a controlled voltage thereto, and the temperature in the reaction tube 26 was raised to 750° C., as monitored by the thermocouple 38.

Helium carrier gas was then introduced through the tube 10 to the flowmeter 12, which adjusted the flow of helium to 1 cm$^3$/second. The helium then passed through the tube 14, through the valve 16, and through the tube 18 into the chamber 20 which contained the mixture of I$_2$(s) and H$_2$O(liquid) which was kept just below 100° C. by the heating elements 19, as monitored by the thermocouple 21. The I$_2$, H$_2$O, He gas mixture then passed through the tube 22, which was heated by the heating elements 23 in order to prevent crystallization of I$_2$(s), and finally entered the reaction tube 26. These reaction conditions were maintained for a period of five hours. During processing, gas reactants passed out of the reaction tube 26 through the alumina tubing 28 to the exit tubing 31, and then to the chamber 32, where excess iodine was solidified and trapped. After processing had been completed, the heating elements 19, 23 and 34 were deactivated by removal of the applied voltage. The valve 16 was then adjusted so that the chamber 20 was by-passed during cool-down so that the helium gas could remove I$_2$ vapor from the apparatus.

By processing a silicon wafer as just described for a period of five hours at atmospheric pressure, an oxide layer deposit, which was predominantly SiO$_2$, was formed on the surface of the silicon wafer to a thickness of 1500 angstroms. The oxide layer so formed was found to be uniform, coherent, and strongly adherent by virtue of being chemically bonded at the interface with the substrate.

By processing a silicon wafer as just described for a period of 5 hours at 750° C., except that oxygen was used as the carrier gas, a layer of SiO$_2$ having a thickness of 1150±50 A was formed. By processing a silicon wafer as just described for 5 hours at 750° C., except that nitrous oxide was used as the carrier gas, a layer of SiO$_2$ having a thickness of 550 A was formed.

By the process of the present invention, a high quality surface oxide layer can be deposited at a temperature which is sufficiently low to provide improved control over diffusion profiles. By suppressing the unacceptable movement of dopants and avoiding this adverse effect, the process of the present invention thus achieves a better control of semiconductor device geometry than was previously attainable by prior art processes described above. In addition, the present invention has the added advantage that processing is performed at one atmosphere of pressure, thus eliminating the need for complex and costly vacuum apparatus. Furthermore, by the process of the present invention, a layer of SiO$_2$ can be deposited at a significantly faster rate than the prior art processes discussed above. By using a low temperature for the oxidation of silicon, the present invention is also able to avoid defect states (stacking faults) which normally occur at the interface of the silicon wafer with the oxide when the oxide is formed at a high temperature.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the silicon substrate described herein, but is intended to include other semiconductor substrates which are capable of surface oxidation and which are capable of withstanding the elevated temperatures required to produce the atomic oxygen used in the present invention. In addition, the scope of the present invention is not limited to processing which uses iodine and water, as described herein, but is intended to include the use of any gas phase molecular reactant that can dissociate off atomic oxygen at an elevated temperature which does not adversely affect the selected substrate. It is also intended to include within the scope of the present invention the use of other carrier gases besides helium, such as oxygen, nitrogen, or carbon dioxide. Furthermore, the apparatus described in relation to FIG. 1 may be adapted to accommodate these various oxygen-producing mixtures. In addition, the apparatus for carrying out the present invention is not limited to the particular configuration described herein, but includes such modifications as may be apparent to one skilled in the semiconductor materials arts and particularly in the art of producing oxide layers.

I claim:

1. A process for forming a coherent, uniform oxide layer on the surface of a silicon wafer which comprises:
    (a) providing said wafer; and
    (b) heating said wafer at 750° C. in a vapor mixture of predetermined amounts of iodine and water that is conducive to the formation of atomic oxygen for a period of time sufficient to enable said oxygen to react with the surface atoms of said wafer to form said uniform, coherent oxide layer.

2. The process as set forth in claim 1 wherein said heating is conducted for a period of 5 hours at one atmosphere pressure and said oxide layer is formed to a thickness of 1500 angstroms.

3. The process as set forth in claim 1 wherein said wafer is doped with impurities to a predetermined concentration and in a predetermined profile, whereby said predetermined elevated temperature is sufficiently low to suppress movement of said dopants in said semiconductor material.

4. The process defined in claim 1 wherein said substrate is heated to an elevated temperature of about 750° C. and a pressure of about one atmosphere for about five hours or more.

* * * * *